April 23, 1968 HIDEO NAKAO 3,379,940

INTEGRATED SYMMETRICAL CONDUCTION DEVICE

Filed Jan. 21, 1965

INVENTOR.
HIDEO NAKAO

BY

Hopgood & Calimafde
ATTORNEYS.

3,379,940
INTEGRATED SYMMETRICAL CONDUCTION DEVICE

Hideo Nakao, Tokyo, Japan, assignor to Nippon Electric Company Limited, Tokyo, Japan, a corporation of Japan Filed Jan. 21, 1965, Ser. No. 426,872
Claims priority, application Japan, Feb. 11, 1964, 39/7,243
4 Claims. (Cl. 317—235)

Figure 1:
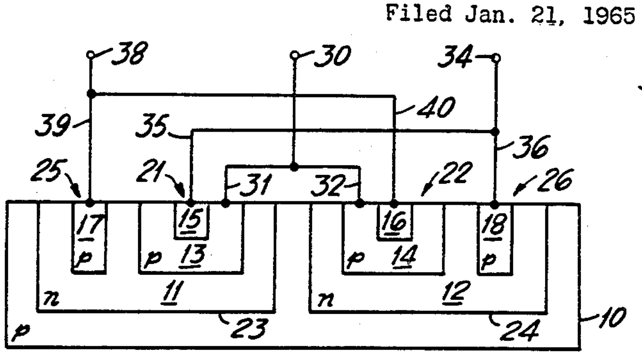

This invention relates to a composite semiconductor circuit device having the characteristics of a symmetrical transistor.

Symmetrical transistors have heretofore been manufactured into a single body by the alloying or diffusion methods, however, it has been difficult to economically provide one having entirely satisfactory current amplification factor and frequency characteristics.

Accordingly, it is an object of this invention to provide a semiconductor circuit device having the characteristics of a symmetrical transistor and yet providing as large a current amplification factor and as good frequency characteristics as a conventional single transistor of the planar type.

A further object of the invention is to provide a semiconductor circuit device having the characteristics of a symmetrical transistor and yet having as large a current amplification factor and as good frequency characteristics as a conventional silicon single planar high-frequency transistor.

According to a preferred aspect of the invention, there is provided a symmetrical transistor device comprising two transistors and a plurality of semiconductor diodes, all of which are formed in a semiconductor single crystal wafer and connected so as to provide the symmetrical characteristics. More particularly, the invention provides a symmetrical transistor device comprising two separate transistors of th same conductivity type which are formed in a semiconductor single-crystal wafer so as to be isolated or insulated from one another by p-n junctions and to serve as the forward and the backward directions of a symmetrical transistor, respectively. At least two semiconductor diodes are also formed in the same semiconductor single-crystal wafer, and connnections are provided to connect the transistors and the diodes in such a manner that when one of the transistors is in the conductive state, the other transistor will be in the nonconductive state. These transistors and diodes may be easily manufactured through the technique of selective diffusion.

Further in accordance with the invention, the two transistors are disposed in close proximity to each other, and this makes it possible not only to form a small-sized symmetrical transistor device but also to manufacture both transistors under the same conditions so as to more easily provide conformity or similarity of characteristics of the two transistors. It is thus possible to furnish a symmetrical transistor device of the invention with highly symmetrical characteristics and with the same order of current amplification factor and frequency characteristics as a single transistor manufactured under the same conditions. It follows therefore that the symmetrical transistor device, if manufactured from a silicon single-crystal wafer, may possess approximately the same current amplification factor and frequency characteristics as a silicon planar high-frequency transistor. Furthermore, a symmetrical transistor device made according to the invention can be made very small in dimensions when two of the semiconductor diodes are formed in the collector regions of the transistors, respectively, in such a manner that each of the diodes is spaced from the base region of that transistor, so as not to affect the characteristics of that transistor. Also, miniaturization of apparatus is served by forming a plurality of symmetrical transistor devices of the invention on one semiconductor single-crystal wafer and enclosing them within a sealing envelope.

More generally, this invention provides a symmetrical transistor device comprising two transistors of the same conductivity type and at least two diode pellets which are, while separated from one another, all attached to a ceramic or other insulator base plate, with connections connecting the transistors and the diode pellets in such a manner that the device exhibits the characteristics of a symmetrical transistor. It is also possible according to the invention to provide a symmetrical transistor device whose characteristics are not perfectly symmetrical but are specifically made different, by selecting transistors of different characteristics for the two transistors to be used therein.

Figure 2:
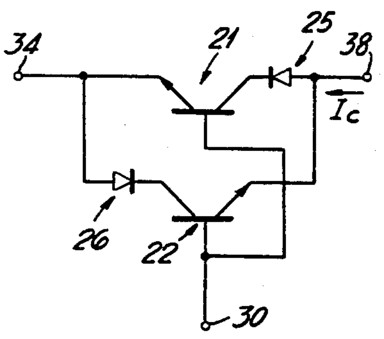
Figure 3:
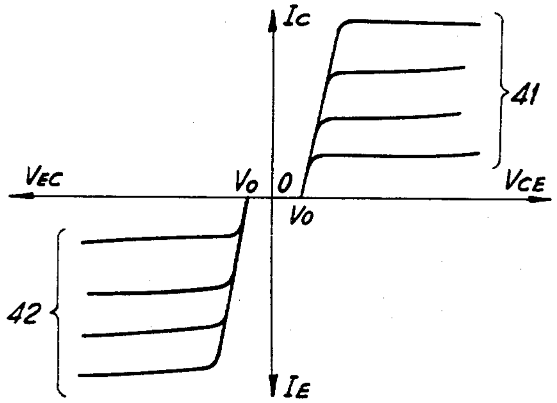
Figure 5:
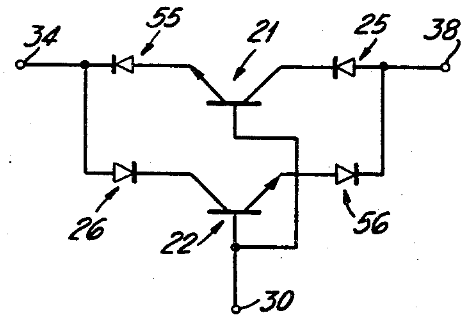
Figure 4:
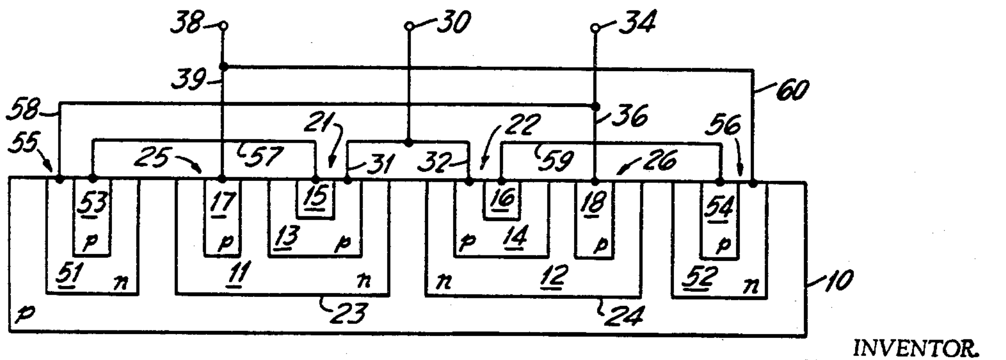

All of the objects, features and advantages of this invention and the manner of attaining them will become more apparent and the invention itself will be best understood by reference to the following description of an embodiment of the invention taken in conjunction with the accompanying drawing, in which FIG. 1 schematically shows a first embodiment of the invention, FIG. 2 shows the equivalent circuit of the first embodiment, FIG. 3 indicates typical characteristics of a symmetrical transistor device of the invention, FIG. 4 shows in schematic form a second embodiment of the invention, and FIG. 5 shows the equivalent circuit of the second embodiment.

Referring now to FIG. 1, a first embodiment of the invention comprises a p-type silicon single-crystal wafer 10, first and second n-type collector regions 11 and 12 formed in the p-type silicon single-crystal wafer 10, first and second n-type base regions 13 and 14 formed in the collector regions 11 and 12 respectively, first and second n-type emitter regions 15 and 16 formed in the base regions 13 and 14 respectively, and first and second p-type regions 17 and 18 formed, preferably simultaneously, with the first and second base regions 13 and 14, in the first and the second collector regions 11 and 12 in spaced relation to these base regions 13 and 14 respectively. The first collector, base, and emitter regions 11, 13 and 15 and the second collector, base, and emitter regions 12, 14, and 16 serve as first and second n-p-n transistors 21 and 22, respectively, which are insulated from each other twice by first and second p-n junctions 23 and 24. The collector regions 11 and 12 of these transistors 21 and 22 and the first and second p-type regions 17 and 18 serve as first and second n-p diodes 25 and 26, respectively. The portion of the semiconductor material located outside the p-n junctions 23 and 24 comprises a residual region of the single crystal wafer.

The first embodiment of the invention further comprises lead wires 31 and 32 connecting the respective base regions 13 and 14 of the first and the second transistors 21 and 22 to a base terminal 30 of the symmetrical transistor device. Lead wires 35 and 36 connect the emitter region 15 of the first transistor 21 and the p-type region 18 of the diode 26 formed in the collector region 12 of the second transistor 22, to a terminal 34 which may be called, for the sake of convenience, the emitter terminal of the device of FIG. 1. Lead wires 39 and 40 connect the p-type region 17 of the diode 25 formed in the collector region 11 of the first transistor 21 and the emitter region 16 of the second transistor 22, to a terminal 38, called for convenience, the collector terminal. The first embodiment comprises the equivalent circuit illustrated in FIG. 2, and forms a composite semiconductor circuit device which operates on the whole as a single symmetrical transistor.

Reference is further made to FIG. 2, and also to FIG. 3 wherein the collector-emitter voltage $V_{CE}$ and the emitter-collector voltage $V_{EC}$ are plotted along the abscissa to the right and to the left of the ordinate, respectively, and the collector current $I_C$ and the emitter current $I_E$ are plotted upward and downward along the ordinate, respectively. Now considering a collector-emitter voltage $V_{CE}$ supplied between the collector and emitter terminals 34 and 38 with a polarity to make the collector terminal 38 positive, and an input voltage impressed between the base and collector terminals 30 and 38 with a polarity to make the base terminal 30 positive, a forward bias will be provided to the emitter junction of the first transistor 21 and will put this first transistor 21 in the conductive state in cooperation with the first diode 25 which is connected in the forward direction for the collector current $I_C$, while providing a backward bias to the emitter junction of the second transistor 22 to keep this transistor in the non-conductive state in cooperation with the second diode 26 which prevents application of sufficient forward voltage to the collector junction of this second transistor 22. Under such voltage conditions, the characteristics of the composite semiconductor circuit device are represented by a group of curves 41, as seen in FIG. 3, which are obtained by shifting the characteristic curves of the first transistor 21 by a voltage equal to the forward voltage drop $V_0$ of the first diode 25.

When an emitter-collector voltage $V_{EC}$ is applied between the collector and the emitter terminals 38 and 34 with the emitter terminal 34 made positive while an input voltage is supplied between the base and the collector terminals 30 and 38 with the base terminal 30 kept positive, then the first and second transistors 21 and 22 are placed in the non-conductive and the conductive states, respectively, with the result that the characteristics of this composite semiconductor circuit device are represented by a group of curves 42, as seen in FIG. 3, which are obtained by shifting the characteristic curves of the second transistor 22 by the forward voltage drop $V_0$ of the second diode 26. Thus, the composite semiconductor circuit device has the characteristics of a symmetrical transistor as illustrated in FIG. 3.

The symmetrical transistor device of the invention therefore has build-up voltages $\pm V_0$ which are introduced by the forward voltage drops of the diodes 25 and 26, respectively. The build-up voltage $V_0$ is only of the order of 0.7 volt where silicon is used as the material and does not provide any difficulty when the device is put into operation with a signal having an amplitude greater than the build-up voltage. Furthermore, the build-up voltage $V_0$ serves not as a disadvantage but rather as an advantage when it is intended to make the device respond only to a signal exceeding a predetermined voltage and particularly when the device is employed as a switching element. Incidentally, the breakdown voltages of the symmetrical transistor device between the emitter and the base terminals 34 and 30 and between the collector and the base terminals 38 and 30 are equal to the breakdown voltages of the respective emitter-base junctions of the transistors 21 and 22 and are generally of the order of ten volts when the transistors 21 and 22 are of the silicon diffusion type.

Referring to FIGS. 4 and 5, a second embodiment of the invention is shown and comprises, besides the p-type and the n-type regions of the first embodiment illustrated in FIGS. 1 and 2, first and second n-type cathode regions 51 and 52 which are formed in the wafer 10, preferably simultaneously with the first and second collector regions 11 and 12, and are spaced from the first and the second transistors 21 and 22. Also provided, are first and second p-type anode regions 53 and 54 which are formed in the n-type regions 51 and 52, respectively, preferably simultaneously with the first and the second base regions 13 and 14. The first n and p type regions 51 and 53 and the second n and p type regions 52 and 54 serve as third and fourth n-p diodes 55 and 56, respectively. This second embodiment also comprises lead wires 31 and 32 connecting the base regions 13 and 14 of the first and second transistors 21 and 22 to the base terminal 30 of the symmetrical transistor device, an internal lead wire 57 interconnecting the emitter region 15 of the first transistor 21 with the anode region 53 of the third n-p diode 55, lead wires 58 and 36 connecting the n-type region 51 of the third n-p diode 55 and the p-type region 18 of the second n-p diode 26 to the emitter terminal 34, another internal lead wire 49 interconnecting the emitter region 16 of the second transistor 22 with the anode region 54 of the fourth n-p diode 56, the lead wires 39 and 60 connecting the n-type region 52 of the fourth n-p diode 56 and the p-type region 17 of the first n-p diode 25 to the collector terminal 38.

In this second embodiment, the breakdown voltage is greater than in the embodiment of FIGS. 1 and 2, because the third and fourth n-p diodes 55 and 56 are provided between the emitter and base terminals 34 and 30 and between the collector and base terminals 38 and 30, respectively.

While the invention has been explained above in conjunction with symmetrical transistor devices, each of which comprises two n-p-n transistors, it will be apparent that these transistors may also be p-n-p transistors if desired. Furthermore, although it will be appreciated that the semiconductor single-crystal wafer on which the symmetrical transistor device is preferably formed may be either a p-type or an n-type one, it should be noted that such wafer may also be a nearly intrinsic semiconductor material.

While the foregoing description sets forth the principles of the invention in connection with specific apparatus, it is to be understood that the description is made only by way of example and not as a limitation of the scope of the invention as set forth in the objects thereof and in the accompanying claims.

What is claimed is:

1. A symmetrical transistor device comprising
a semiconductor wafer having a first conductivity type,
first and second transistors of the same conductivity type formed in said wafer and spaced from each other therein,
each of said transistors having a collector region of a second conductivity type, a base region of said first conductivity type and an emitter region of said second conductivity type,
a first diode region of said first conductivity type formed in the collector region of said first transistor,
said first diode region forming a first diode with the collector region in which it is formed,
a second diode region also of said first conductivity type formed in the collector region of said second transistor,
said second diode region forming a second diode with the collector region in which it is formed,
said device having first, second and third terminals,
conductive means connecting the emitter region of said first transistor to said second diode region and also to said first terminal,
conductive means connecting the base regions of each transistor together and also to said second terminal,
and conductive means connecting the emitter region of said second transistor to said first diode region and also to said third terminal, whereby upon the application of suitable potentials to said terminals one of said transistors will be in the conductive state while the other of said transistors is in the non-conductive state.

2. The invention described in claim 1 wherein said first conductivity type and said second conductivity type are p and n types respectively, said first and second diode regions comprise diode anodes, and said first, second and third terminals comprise emitter, base and collector terminals, respectively, of said device.

3. The invention described in claim 1 wherein said first and second transistors are separated from each other by means of a pair of p-n junctions disposed in series physical relationship between said transistors.

and said junctions being formed by the collector regions of said transistors and a separating region comprising a portion of said wafer material of said first conductivity type.

4. A symmetrical transistor device comprising a semiconductor wafer having a first conductivity type.

first and second transistors of the same conductivity type formed in said wafer and spaced from each other therein.

said first diode region forming a first diode with the second conductivity type, a base region of said first conductivity type and an emitter region of said second conductivity type.

a first diode region of said first conductivity type formed in the collector region of said first transistor, said first diode region forming a first diode with the collector region in which it is formed.

a second diode region also of said first conductivity type formed in the collector region of said second transistor.

said second diode region forming a second diode with the collector region in which it is formed, a third diode formed in said wafer, said third diode comprising a region of said second conductivity type and a region of said first conductivity type formed therein, a fourth diode also comprising a region of said second conductivity type and a region of said first conductivity type formed therein, conductive means connecting the emitter region of said first transistor to the region of first conductivity type of said third diode, conductive means connecting the emitter region of said second transistor to the region of first conductivity type of said fourth diode, said device having first, second and third terminals, conductive means connecting the region of second conductivity type of said third diode to said second diode region and also to said first terminal, and conductive means connecting the base regions of each transistor together and also to said second terminal, conductive means connecting the region of second conductivity type of said fourth diode to said first diode region and also to said third terminal, whereby upon the application of suitable potentials to said terminals one of said transistors will be in the conductive state while the other of said transistors is in the non-conductive state.

References Cited

UNITED STATES PATENTS

| | | | |
|---|---|---|---|
| 3,153,187 | 10/1964 | Klees | 323—22 |
| 3,197,710 | 7/1965 | Hung Chang Lin | 330—38 |
| 2,981,877 | 4/1961 | Noyce | 317—235 |
| 3,153,187 | 10/1964 | Klees | 323—22 |

JOHN W. HUCKERT, *Primary Examiner.*

R. SANDLER, *Assistant Examiner.*

UNITED STATES PATENT OFFICE
CERTIFICATE OF CORRECTION

Patent No. 3,379,940

April 23, 1968

Hideo Nakao

It is certified that error appears in the above identified patent and that said Letters Patent are hereby corrected as shown below:

Column 5, line 22, "said first diode region forming a first diode with the" should read -- each of said transistors having a collector region of a --.

Signed and sealed this 3rd day of March 1970.

(SEAL)
Attest:

Edward M. Fletcher, Jr.
Attesting Officer

WILLIAM E. SCHUYLER, JR.
Commissioner of Patents